United States Patent
Lau et al.

(10) Patent No.: US 10,520,535 B1
(45) Date of Patent: Dec. 31, 2019

(54) GROUNDLESS RADIO FREQUENCY TEST PROBE

(71) Applicant: Amazon Technologies, Inc., Seattle, WA (US)

(72) Inventors: Kwan Yin Lau, Hong Kong (CN);
Chin Hsiu Chuang, Guangzhou (CN);
Adrian Napoles, Cupertino, CA (US)

(73) Assignee: Amazon Technologies, Inc., Seattle, WA (US)

( * ) Notice: Subject to any disclaimer, the term of this patent is extended or adjusted under 35 U.S.C. 154(b) by 456 days.

(21) Appl. No.: 15/222,658

(22) Filed: Jul. 28, 2016

(51) Int. Cl.
*G01R 29/10* (2006.01)
*G01R 1/067* (2006.01)
*G01R 31/28* (2006.01)

(52) U.S. Cl.
CPC ......... *G01R 29/10* (2013.01); *G01R 1/06772* (2013.01); *G01R 1/06722* (2013.01); *G01R 31/2822* (2013.01)

(58) Field of Classification Search
CPC .... G01R 29/10; G01R 31/2822; G01R 1/067; G01R 1/06722; G01R 1/06716; G01R 1/06766; G01R 1/06772; G01R 27/16; G01R 27/02; G01R 27/04; G01R 31/025
See application file for complete search history.

(56) References Cited

U.S. PATENT DOCUMENTS

| 6,236,223 B1* | 5/2001 | Brady ............... G01R 31/2822 324/750.3 |
| 2005/0212544 A1* | 9/2005 | Nakajima ............ G01R 1/0408 324/750.25 |
| 2005/0225347 A1* | 10/2005 | Khandros ............ G01R 1/0491 324/754.03 |
| 2011/0254123 A1* | 10/2011 | Sellathamby ........... H01L 23/48 257/531 |
| 2012/0068728 A1* | 3/2012 | Kataoka ............ G01R 31/2887 324/756.03 |
| 2013/0307753 A1* | 11/2013 | Andrenko .............. H01Q 1/243 343/904 |
| 2014/0091978 A1* | 4/2014 | Yamagajo .............. H01Q 5/335 343/843 |

* cited by examiner

*Primary Examiner* — Huy Q Phan
*Assistant Examiner* — Dustin R Dickinson
(74) *Attorney, Agent, or Firm* — Lowenstein Sandler LLP

(57) ABSTRACT

A groundless radio frequency (RF) test probe comprises a first connector to receive a signal from a system under test and a second connector to present the signal as an output. The probe further comprises an antenna array coupled between the first connector and the second connector, the antenna array to couple the signal from the first connector to the second connector, wherein the antenna pair is impedance matched with the system under test. The probe does not have a physical ground connection with the system under test.

20 Claims, 5 Drawing Sheets

GROUNDLESS RADIO FREQUENCY TEST PROBE

BACKGROUND

Users enjoy entertainment through the consumption of media items, including electronic media, such as electronic books (also referred to herein as ebooks), electronic newspapers, electronic magazines, other electronic publications, audio books, and digital video. Users employ various electronic devices to consume such media items. Among these electronic devices are electronic book readers, cellular telephones, personal digital assistants (PDAs), portable media players, tablet computers, electronic pads, netbooks, desktop computers, notebook computers, and the like. These electronic devices wirelessly communicate with a communications infrastructure to enable the consumption of the digital media items. In order to wirelessly communicate with other devices, these electronic devices include one or more antennas.

BRIEF DESCRIPTION OF THE DRAWINGS

The present disclosure will be understood more fully from the detailed description given below and from the accompanying drawings of various embodiments of the present invention, which, however, should not be taken to limit the present invention to the specific embodiments, but are for explanation and understanding only.

DETAILED DESCRIPTION

Figure 1:
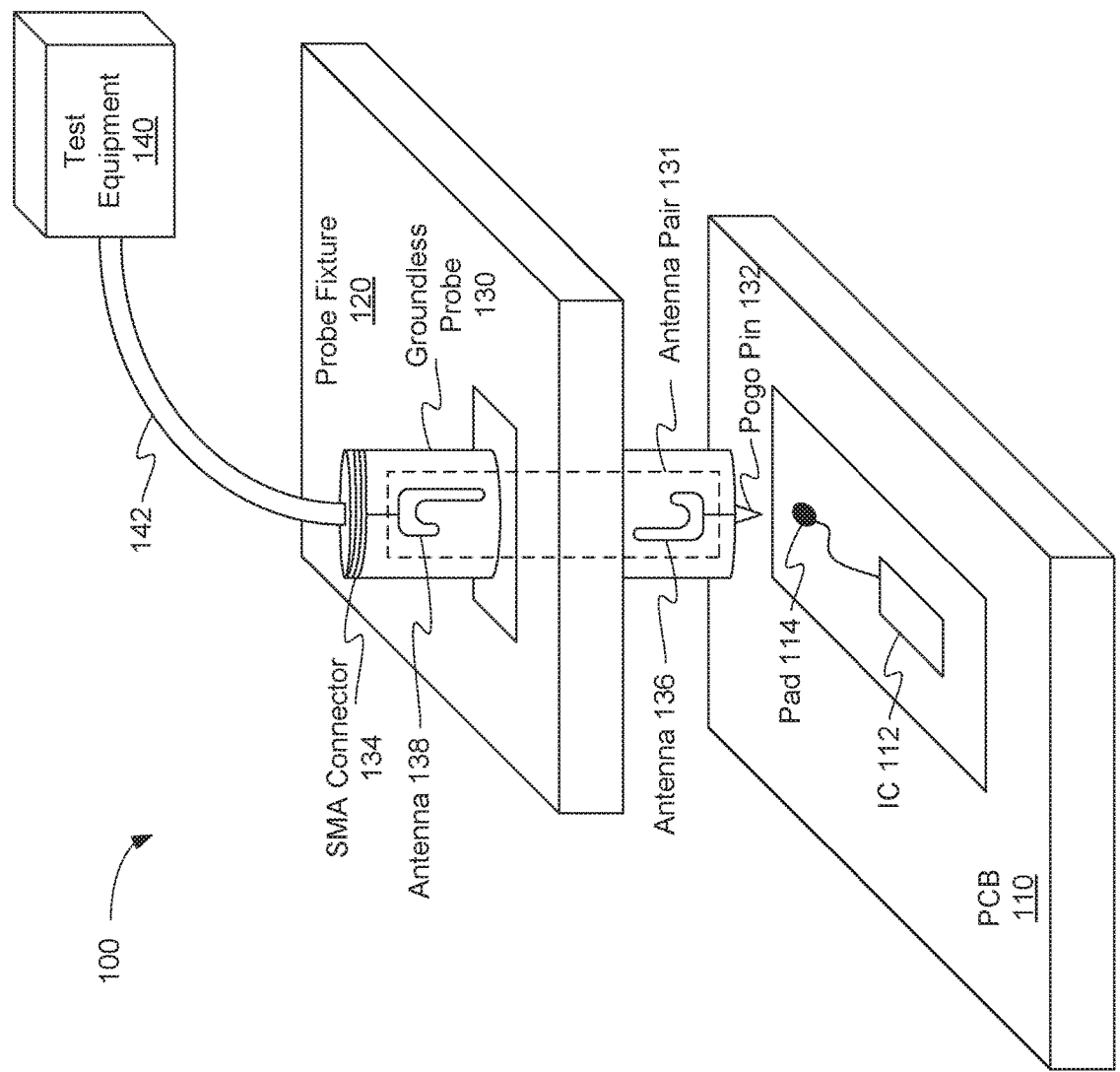
FIG. 1 is a block diagram illustrating a test environment for utilizing a groundless radio frequency (RF) test probe, according to an embodiment.

Embodiments are described for a groundless radio frequency (RF) test probe. In one embodiment, the probe is design to be utilized during a testing stage of the manufacturing process of certain types of integrated circuits (ICs) present on a printed circuit board (PCB). The probe is design to capture a signal from the PCB, such as an RF signal output of the integrated circuit at a test pad, for example, and provide the RF signal to test equipment connected to the probe by a coaxial cable or other connection. The test equipment can be utilized to measure and analyze the captured RF signal and compare it against expected performance characteristics.

Certain probes, whether designed to work with a land pattern, RF switch connector, or coaxial connector on the PCB, may utilize two separate connections with the PCB; one to capture the RF signal and a second physical ground connection. With any connection, there exists the possibility of connection errors (e.g., when the probe is misaligned with the pad on the PCB or otherwise makes an imperfect connection). An imperfect ground connection can lead to inaccurate measurement results due to the ground reference not being at an expected level. This may cause uncertainty in the production of the integrated circuits and the test equipment can give a high number of "false" failures where measurement is attributable to the connection error.

In one embodiment, a groundless RF test probe described herein does not have a ground connection with the PCB. In one embodiment, the probe includes a first connector, such as a pogo pin or other spring-loaded contact connector, to make contact with the test pad on the PCB under test and to receive an RF signal from the test pad. The probe may further include a second connector, such as a sub-miniature version A (SMA) connector or other coaxial RF connector, to present the received RF signal as an output to the test equipment connected to the probe. In one embodiment, the probe further includes an antenna pair coupled between the first and second connectors. The antenna pair may include a first antenna and a second antenna designed to couple the signal received by the pogo pin to the SMA connector for output. In one embodiment, the first and second antennas are impedance matched with the system under test and with the test equipment. For example, the antenna pair may be designed to present a probe impedance of 50 ohms for the RF signal in a frequency range of WiFi™ signals—approximately 2 to 5 gigahertz (GHz). This may match a board impedance of the PCB under test, as well as an impedance of the test equipment.

The antenna pair can provide impedance matching to ensure maximum power transfer through the probe without the need for a ground connection. Since the groundless RF test probe has only a single connection with the PCB (e.g., the pogo pin to receive the RF test signal), the chances of connection errors are greatly reduced. The groundless RF test probe can achieve measurements well-within the acceptable margins for most testing processes. For example, the groundless RF test probe can be expected to provide a maximum power variation of less than approximately 0.25 decibels (db) in the range of approximately 2 to 5 GHz. Additional details of the groundless RF test probe are provided below.

FIG. 1 is a block diagram illustrating a test environment 100 for utilizing a groundless RF test probe 130, according to an embodiment. In one embodiment, probe 130 may be utilized during a testing stage of the manufacturing process of one or more integrated circuits 112 embodied on a PCB 110 or other substrate. The probe 130 may capture an RF signal output of the integrated circuit 112 at a test pad 114 on PCB 110. Groundless probe 130 may provide the captured RF signal to test equipment 140 connected to the probe 130 by a coaxial cable 142 or other connection. Test equipment 140 can be utilized to measure and analyze the captured RF signal and compare it to expected performance characteristics.

In one embodiment, the groundless RF test probe 130 includes a first connector, such as a pogo pin 132 to make contact with the test pad 114 on the PCB 110. Pogo pin 132 may receive an RF signal or other signal from the test pad 114. In other embodiments, some other connector may be used to receive the signal from the device under test. The probe 130 may further include a second connector, such as SMA connector 134, to present the received RF signal as an output to the test equipment 140. In one embodiment, coaxial cable 142 connects to probe 130 via SMA connector 134 and provides the RF signal to test equipment 140.

In one embodiment, the probe 130 further includes an antenna pair 131 formed from at least a first antenna 136 and a second antenna 138 designed to couple the signal received by the pogo pin 132 to the SMA connector 134 for output. In one embodiment, the first and second antennas 136 and 138 are impedance matched with the integrated circuit 112 and with the test equipment 140. For example, the antenna pair 131 may be designed to present an impedance of 50 ohms for the RF signal in a frequency range of approximately 2 to 5 GHz. In other embodiments, where the system under test and/or the test equipment have impedances other than 50 ohms, the antenna pair 131 may be designed to present a corresponding impedance value. In some embodiments, probe 130 may be tunable to provide impedance matching over a range of different frequencies. Additional details of the antenna pair 131 are provided below with respect to FIG. 2.

In one embodiment, test equipment 140 may be any type of electronic test equipment capable of measuring the RF signal from integrated circuit 112. For example, test equipment 140 may include a spectrum analyzer design to measure the magnitude of the input signal versus frequency within a given frequency range. By analyzing the spectra of the input signal, a spectrum analyzer can observe and measure dominant frequency, power, distortion, harmonics, bandwidth and other spectral components.

In one embodiment, integrated circuit 112 may be part of a wireless data communications system. For example, integrated circuit 112 may be a personal area network (PAN) chip designed to provide network connectivity using Bluetooth™, Zigbee™, or any other type of PAN technology. Integrated circuit 112 may also be a wireless local area network (WLAN) chip designed to provide network connectivity using any type of mobile network technology including, for example, cellular digital packet data (CDPD), general packet radio service (GPRS), enhanced data rates for GSM evolution (EDGE), universal mobile telecommunications system (UMTS), 1 times radio transmission technology (1×RTT), evolution data optimized (EVDO), high-speed downlink packet access (HSDPA), WiFi™, etc. Integrated circuit 112 may be designed for use in a computing device, including for example, an electronic book reader, a PDA, a mobile phone, a laptop computer, a portable media player, a tablet computer, an electronic pad, a desktop computer, a camera, a video camera, a netbook, or similar computing device.

In one embodiment, groundless RF probe 130 is affixed to probe fixture 120. Probe fixture 120 may be utilized during the testing process to bring probe 130 into contact with the PCB 110 to test integrated circuit 112. For example, probe fixture 120 may be mechanically lowered over PCB 110 to ensure that pogo pin 132 is properly aligned with test pad 114 and provide a strong connection for the RF signal. In one embodiment, PCB 110 may include a plurality of other integrated circuits in addition to integrated circuit 112, any of which may be tested using groundless RF probe 130. In one embodiment, probe fixture 120 may include a plurality of other probes in addition to probe 130. In this embodiment, a plurality of integrated circuits on PCB 110 may be tested simultaneously using the plurality of probes.

Figure 2:
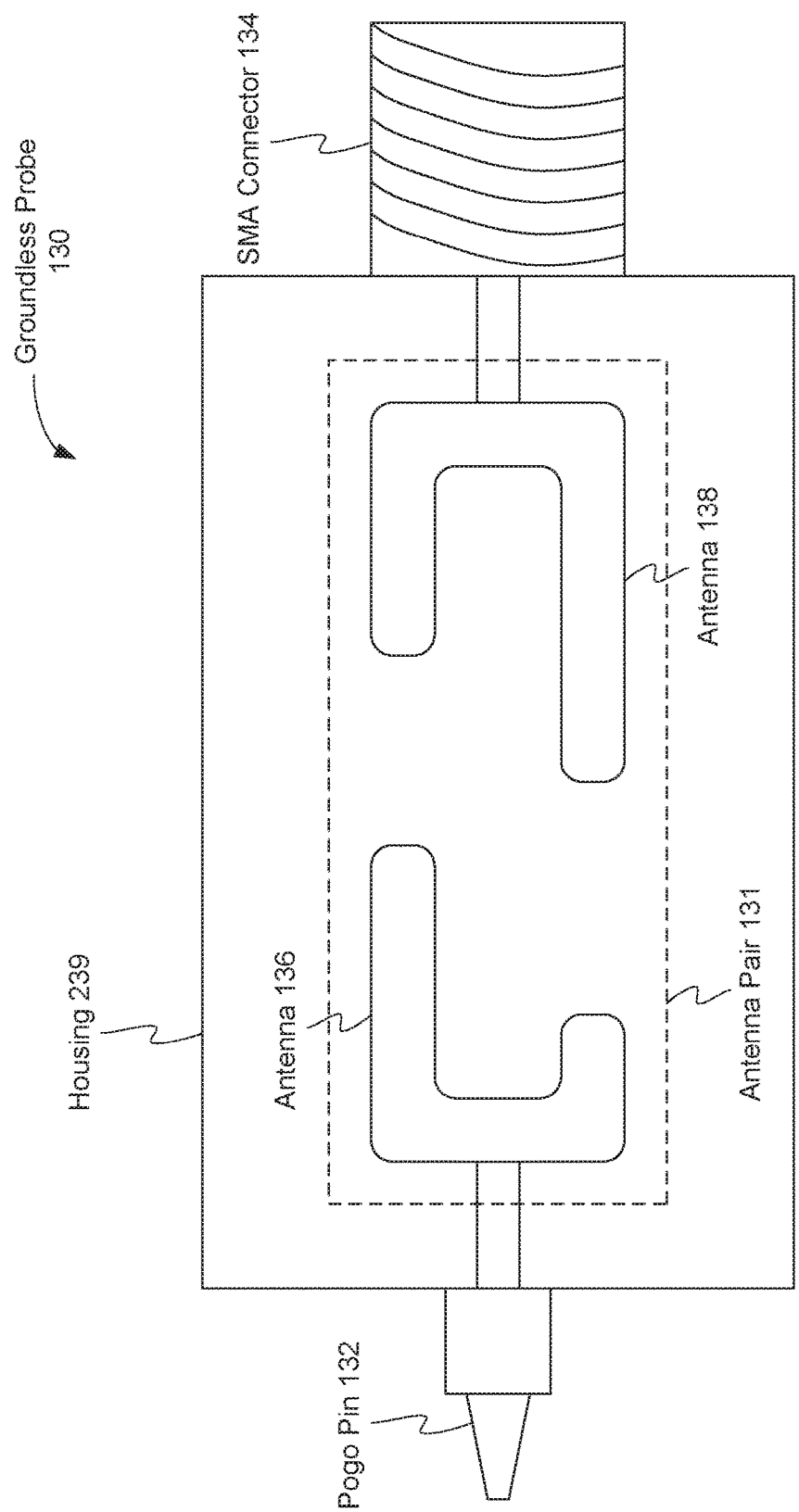
FIG. 2 is a block diagram illustrating a groundless RF test probe, according to an embodiment.

FIG. 2 is a block diagram illustrating a groundless RF test probe 130, according to an embodiment. As described above, groundless RF test probe 130 may include a first connector, such as a pogo pin 132 and a second connector, such as SMA connector 134. In addition, probe 130 may further include antenna pair 131 formed from at least first antenna 136 and second antenna 138. In one embodiment, first antenna 136 and second antenna 138 may reside within a housing 239 and may form an antenna array. In other embodiments, the antenna array may include some other number of antennas.

In one embodiment, pogo pin 132 includes a slender cylinder containing at least one sharp, spring loaded pin. When pogo pin 132 is pressed against a contact, such as test pad 114 on PCB 110, the sharp point at the end of the pin makes secure contact with test pad 114 allowing transfer of a signal through the pogo pin 132. In one embodiment, pogo pin 132 may be formed from a hard metal material and may be plated with a highly conductive substance (e.g., gold) that provides for reliable contact with test pad 114. Within the body of pogo pin 132, the pin itself makes good electrical contact with the body to prevent the internal spring from carrying any portion of the received signal. In other embodiments, probe 130 may utilize some other type of spring-loaded connector, or other contact connector, to capture the signal at test pad 114.

In one embodiment, SMA connector 134 is a coaxial RF connector designed to interface with a coaxial cable 142 using a screw type coupling mechanism. In one embodiment, SMA connector 134 may have a 0.25 inch diameter, 36 thread-per-inch barrel. A female type SMA connector may include a center sleeve surrounded by the barrel with outside threads. In other embodiments, probe 130 may include some other type of RF connector, such as a Type N coaxial RF connector, or other connector to provide the RF signal to test equipment 140.

Antennas 136 and 138 form antenna pair 131 designed to couple the signal received by the pogo pin 132 to the SMA connector 134 for output. In one embodiment, a mutual coupling exists between inductors formed by antennas 136 and 138. The magnetic field from antenna 136 causes an induced current to form in antenna 138, resulting in RF energy transfer. Antennas 136 and 138 may be any of a variety of different antenna types depending on the embodiment, such as for example, whip antennas, monopole antennas, dipole antennas, slot antennas, loop antennas, aperture antennas, etc.

In one embodiment, the antenna pair 131 formed by antennas 136 and 138 is impedance matched with the integrated circuit 112 being tested and with the test equipment 140. For example, in one embodiment, the antenna pair 131 may be designed to present an impedance of approximately 50 ohms for the RF signal in a frequency range of approximately 2 to 5 GHz. The impedance of the antenna pair 131 represents the relation between voltage and current at the input of probe 130. The impedance may include both a real and imaginary portion. The real portion of the antenna impedance represents power that is either radiated away or absorbed within the antenna, while the imaginary portion represents power that is stored in the near field of the antenna. As a result, the impedance of the antenna pair 131 will vary with frequency.

By designing the impedance of the antenna pair 131 to match that of integrated circuit 112 and the test equipment 140, power transfer through probe 130 can be increased or maximized and signal reflection can be decreased or minimized in the frequency band of interest. Various characteristics of the antennas 136 and 138 can be adjusted during design on the antenna pair 131 to achieve the desired impedance, such as the dimensions of each antenna structure including the total length of the antennas, which is a major factor for determining the frequency, and the width of the antennas, which is a factor for impedance matching. In one embodiment, the factors of total length and width are dependent on one another and antennas 136 and 138 may be designed accordingly.

In one embodiment, antenna 136 is coupled to pogo pin 132 and receives the RF signal captured from test pad 114. The RF signal current passes through antenna 136 inducing a magnetic field around antenna 136. The magnetic field, via mutual coupling, induces an equivalent electric current in antenna 138. In one embodiment, antenna 138 is coupled to SMA connector 134, which receives the current from antenna 138. In one embodiment, antennas 136 and 138 are arranged in free space inside of probe housing 239. In another embodiment, antennas 136 and 138 are arranged on opposite sides of a shared substrate (not shown) within probe housing 239. Probe housing 239 may be an enclosure, formed from a metal or other material, surrounding the internal components of probe 130. Probe housing 239 protects the internal components from damage caused by physical contact and shields antennas 136 and 138 from external signals. External signals coupled to either of antennas 136 and 138 could impact the measurements performed by probe 130. By preventing any external signals from coupling to antennas 136 and 138, probe housing 239 can improve the performance of probe 130 in accurately measuring RF signals received via pogo pin 132.

Figure 3:
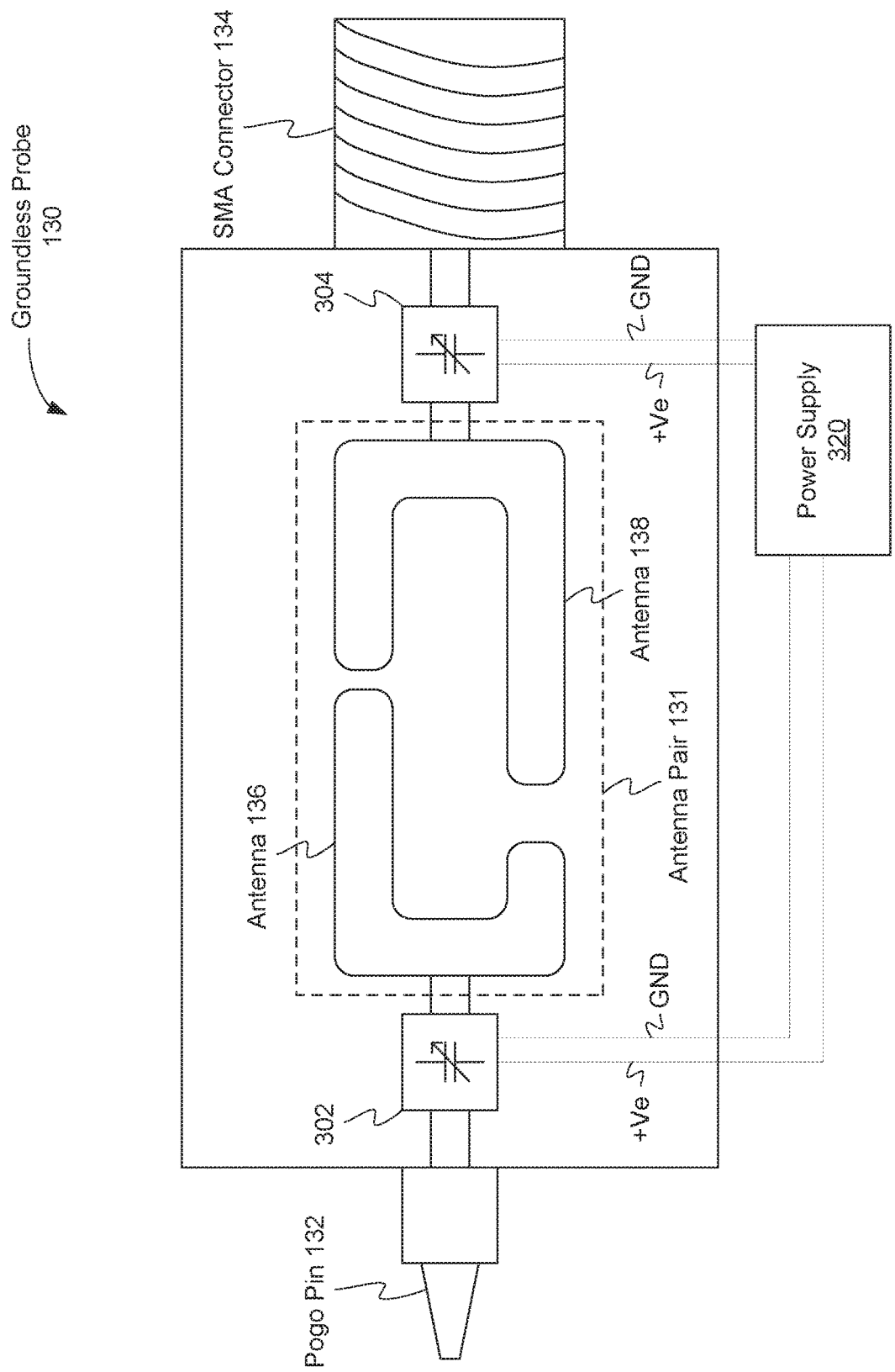
FIG. 3 is a block diagram illustrating a tunable groundless RF test probe, according to an embodiment.

FIG. 3 is a block diagram illustrating a tunable groundless RF test probe 130, according to an embodiment. In one embodiment, in addition to antenna pair 131 including antennas 136 and 138, the internal components of probe 130 include tunable circuits 302 and 304. Tunable circuit 302 may be connected in the signal path between pogo pin 132 and antenna 136 and tunable circuit 304 may be connected in the signal path between antenna 138 and SMA connector 134. In one embodiment, groundless RF test probe 130 may be designed to work with RF signals across a range of frequencies, including those outside a band of 2 to 5 GHz. The tunable matching circuits 302 and 304 may effectively allow the probe to be tuned and provide impedance matching at a number of different frequencies. As a result, a single test probe 130 can be used to test any number of different integrated circuits, PCBs, or other devices, each of which may have test signals at different frequencies. By adjusting the tunable matching circuits 302 and 304, probe 130 can adjust its internal probe impedance for the corresponding frequency to match the board impedance of the device under test.

In one embodiment, tunable circuits 302 and 304 are implemented using varactor diodes, variable capacitors, controlled capacitance integrated circuits, or some other type of tuning diode. Varactors are operated in a reverse-biased state, so that no direct current (DC) flows through the device. The amount of reverse bias controls the thickness of the depletion zone and, therefore, the varactor's junction capacitance. Generally, the depletion region thickness is proportional to the applied voltage, and capacitance is inversely proportional to the depletion region thickness. Thus, the capacitance is inversely proportional to the applied voltage. In other embodiments, one or both of tunable circuits 302 and 304 may include a variable inductor, a series inductor-capacitor circuit, a parallel inductor-capacitor circuit, a hybrid series/parallel inductor-capacitor circuit, or some other arrangement of passive elements. In one embodiment, probe 130 may only include one of tunable circuits 302 and 304, such that only one of antennas 136 and 138 may be tuned.

In one embodiment, tunable circuits 302 and 304 are connected to an external power supply module 320. Power supply module 320 can provide a DC voltage (+Ve) to power tunable circuits 302 as well as a ground signal (GND). In one embodiment, by adjusting the DC voltage (+Ve) applied to each of tunable circuits 302 and 304, the capacitance of tunable circuits 302 and 304 will change, thereby affecting the resonant frequency of antennas 136 and 138 and allowing a probe impedance presented by probe 130 for the current frequency to be matched to a board impedance of the system under test (e.g., IC 112). Power supply module 320 can provide a different DC voltage (+Ve) at the request of an operator or processing device to configure probe 130 for use with a given system under test. Although, external power supply module 320 provides a ground signal (GND) to tunable circuits 302 and 304, pogo pin 132 remains un-grounded and does not require any separate ground connection with the system under test.

Figure 4:
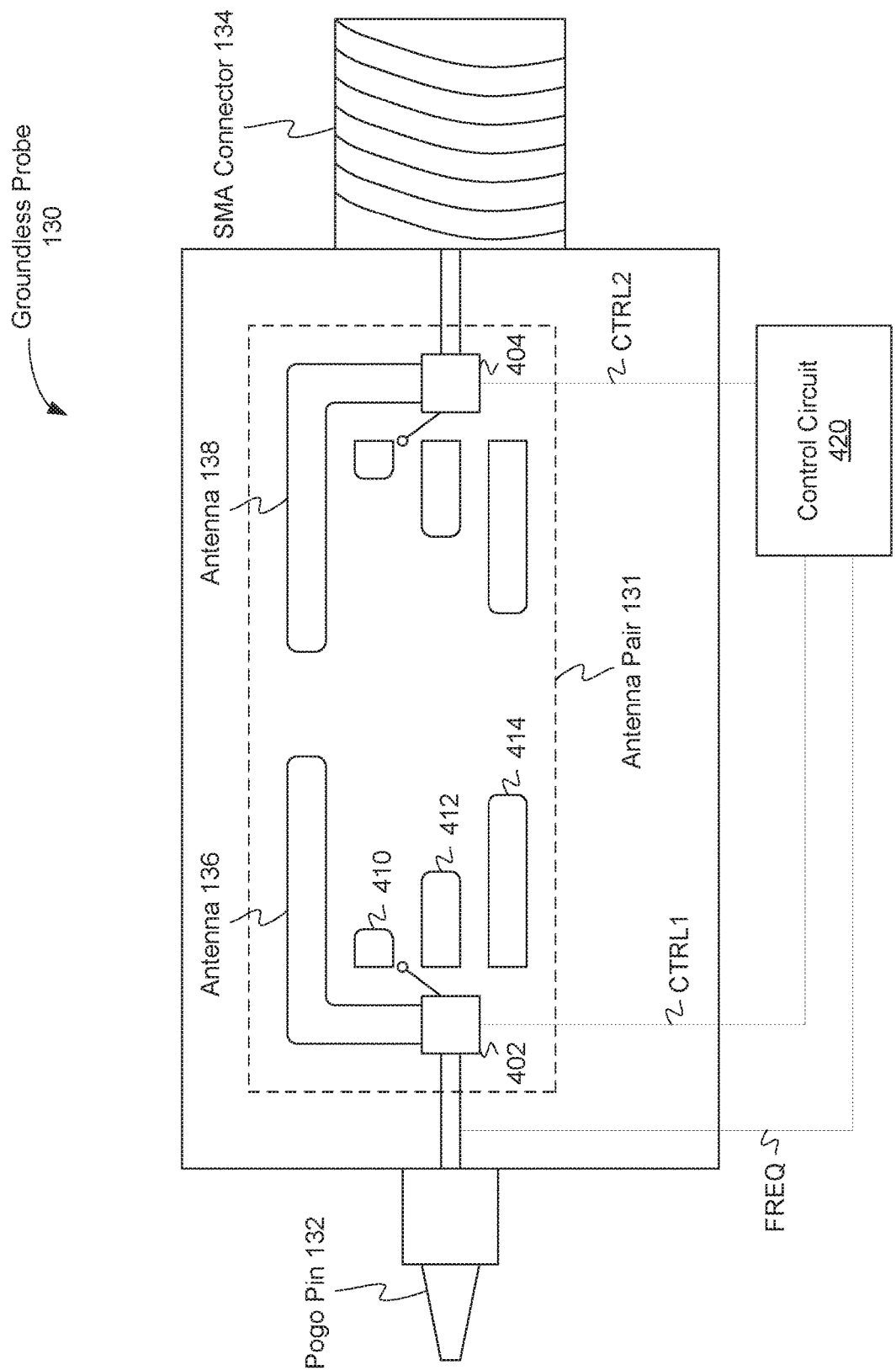
FIG. 4 is a block diagram illustrating a tunable groundless RF test probe according to an embodiment.

FIG. 4 is a block diagram illustrating a tunable groundless RF test probe 130, according to an embodiment. In one embodiment, antenna pair 131 including antennas 136 and 138 of probe 130 are tunable by physically switching the arm lengths of the antenna arms. For example, antenna 136 may include a switching circuit 402 configured to alternately connect antenna arms 410, 412, 414, each having a different arm length. In one embodiment, switching circuit 402 is controlled by control signal CTRL1 received from control circuit 420. Switching circuit 404 may similarly switch the arm lengths of the antenna arms in antenna 138 based on control signal CTRL2. In one embodiment, switching between antenna arms of different lengths can adjust the resonant frequency of antennas 136 and 138, thereby allowing a probe impedance presented by probe 130 for the current frequency to be matched to a board impedance of the system under test (e.g., IC 112).

In one embodiment, switching circuits 402 and 404 are implemented using an electromagnetic relays, solid state switches, microelectromechanical system (MEMS) switches, PIN diodes, or some other type of switching circuit. In one embodiment, switching circuits 402 and 404 are connected to control circuit 420. Control circuit 420 can provide control signals CTRL1 and CTRL2 to switching circuits 402 and 404 respectively. Depending on the value of control signal CTRL, for example, switching circuit 402 can connect different antenna arms 410, 412, 414 in antenna 136 to adjust the arm length of the antenna 136. In one embodiment, the lengths of antenna arms 410, 412, 414 correspond to different frequencies of the signal received by pogo pin 132, such that for a first frequency, control circuit 420 can be programmed to configure switching circuit 402 to connect antenna arm 410, whereas for a second frequency, control circuit 420 can be programmed to configure switching circuit 402 to connect antenna arm 412. For example, if probe 130 was first used to test signals with a frequency of 5 GHz and then was used to test signals with a frequency of 2.4 GHz, it may be desirable to increase the arm length of antenna 136 to maintain the impedance matching. In one embodiment, control circuit 420 and the values of control signals CTRL1 and CTRL2 are preconfigured. In another embodiment, control circuit 420 can sense the frequency of the signal received at pogo pin 132 via signal FREQ, and can dynamically adjust CTRL1 and CTRL2 to adjust the arm lengths of antennas 136 and 138. Although, switching circuits 402 and 404 may be grounded in some embodiments, pogo pin 132 remains un-grounded and does not require any separate ground connection with the system under test.

Figure 5:
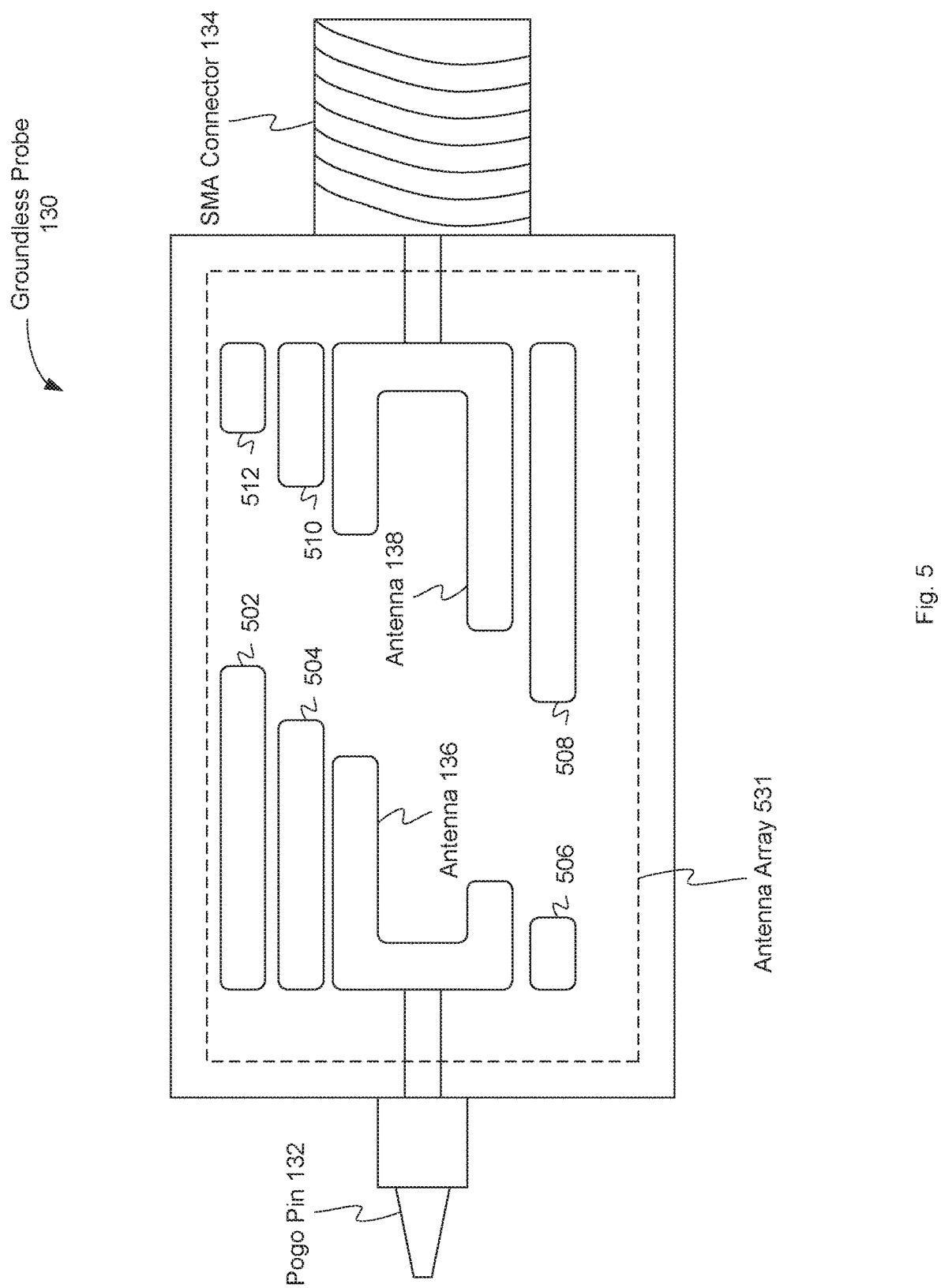
FIG. 5 is a block diagram illustrating a groundless RF test probe with parasitic elements, according to an embodiment.

FIG. 5 is a block diagram illustrating a groundless RF test probe 130 with parasitic elements, according to an embodiment. In one embodiment, probe 130 includes antenna array 531 which is made up of antenna 136, parasitic elements 502, 504, 506, antenna 138, and parasitic elements 508, 510, 512. Parasitic elements 502, 504, 506 may be associated with antenna 136, while parasitic elements 508, 510, 512 may be associated with antenna 138.

Parasitic elements 502-512 may be conductive element, (e.g., metal traces or wires) which are not electrically connected to anything else in probe 130. In one embodiment, antennas 136 and 138 can be referred to as "driven elements" which are connected to the pogo pin 132 and SMA connector 134, respectively, through feed lines. Parasitic elements 502-512, however, are not connected to either of pogo pin 132 or SMA connector 134 or to either of antennas 136 and 138. The purpose of the parasitic elements 502-512 is to modify the radiation pattern of the radio waves emitted by antennas 136 and 138, directing them in a beam in one direction, increasing the antennas' directivity (i.e., gain). Parasitic elements 502-512 act as passive resonators, absorbing the radio waves from antennas 136 and 138 and re-radiating them again with different phases. The waves from the different parasitic elements interfere, strengthening the antenna's radiation in the desired direction, and cancelling out the waves in undesired directions.

In one embodiment, each of parasitic elements 502, 504, 506 and 508, 510, 512 has a different length. Each length may be tailored to a particular frequency of the RF signal received at pogo pin 132 from IC 112. For example, the length of each parasitic element 502-512 may be approximately half of a wavelength of the corresponding RF signal. In some embodiments, the parasitic elements 502-512 may be slightly longer (e.g., ~5%) (i.e., a "reflector") or slightly shorter (e.g., ~5%) (i.e., a "director"). The use of parasitic elements 502-512 may thus increase the size of the frequency band over which probe 130 can present the desired probe impedance.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

In the above description, numerous details are set forth. It will be apparent, however, to one of ordinary skill in the art having the benefit of this disclosure, that embodiments of the invention may be practiced without these specific details. In some instances, well-known structures and devices are shown in block diagram form, rather than in detail, in order to avoid obscuring the description.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining", "identifying", "adding", "selecting" or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A groundless radio frequency (RF) test probe comprising:
   a housing;
   a pogo pin connector to make contact with a test pad on a printed circuit board (PCB) under test, the pogo pin to receive an RF signal from the test pad, wherein at least a portion of the pogo pin connector is external to the housing;
   an antenna pair residing within the housing, the antenna pair comprising a first antenna and a second antenna, wherein the first antenna is coupled to the pogo pin connector, the first antenna to transmit the RF signal to the second antenna, wherein the first antenna and the second antenna are designed to present a probe impedance that matches a board impedance of the PCB under test, wherein the first antenna and the second antenna are mounted on opposite sides of a shared substrate within the housing, and wherein the probe does not have a physical ground connection with the PCB under test; and
   a sub-miniature version A (SMA) connector coupled to the second antenna, the SMA connector to receive the RF signal from the second antenna and provide the RF signal to test equipment connected to the probe, wherein at least a portion of the SMA connector is external to the housing.

2. The groundless RF test probe of claim 1, wherein the probe impedance is approximately 50 ohms in a frequency range of approximately 2 to 5 gigahertz (GHz).

3. The groundless RF test probe of claim 1, further comprising:
   a tunable matching circuit coupled to the antenna pair, where in response to a frequency of the RF signal changing from a first frequency to a second frequency, the tunable matching circuit to adjust a resonant frequency of the antenna pair so that the probe impedance at the second frequency matches the board impedance at the second frequency.

4. The groundless RF test probe of claim 1, further comprising:
   a switching circuit coupled to the antenna pair, where in response to a frequency of the RF signal changing from a first frequency to a second frequency, the switching circuit to adjust an arm length of at least one of the first antenna and the second antenna so that the probe impedance at the second frequency matches the board impedance at the second frequency.

5. An apparatus comprising:
   a housing;

a first connector coupled to the housing to receive a signal from a system under test;
a second connector coupled to the housing to output the signal; and
an antenna array disposed within the housing and coupled between the first connector and the second connector, the antenna array to couple the signal from the first connector to the second connector, wherein the antenna array is impedance matched with the system under test, wherein the antenna array comprises a first antenna and a second antenna mounted on opposite sides of a shared substrate within the housing, and wherein the apparatus does not have a physical ground connection to the system under test.

6. The apparatus of claim 5, wherein the first connector comprises a spring-loaded contact connector configured to contact a test pad on the system under test.

7. The apparatus of claim 5, wherein the second connector comprises a coaxial radio frequency (RF) connector configured to interface with a coaxial cable coupled between the apparatus and test equipment.

8. The apparatus of claim 5, wherein the first antenna is coupled to the first connector and the second antenna is coupled to the second connector.

9. The apparatus of claim 8, wherein the antenna array further comprises:
a first parasitic element adjacent to the first antenna, the first parasitic element having a first length, the first length associated with a first frequency of the signal, wherein the first parasitic element to provide impedance matching between the apparatus and the system under test at the first frequency.

10. The apparatus of claim 9, wherein the antenna array further comprises:
a second parasitic element adjacent to the second antenna, the second parasitic element having a second length, the second length associated with a second frequency of the signal, wherein the second parasitic element to provide impedance matching between the apparatus and the system under test at the second frequency.

11. The apparatus of claim 5, further comprising:
a tunable matching circuit coupled to the antenna array, where in response to a frequency of the signal changing from a first frequency to a second frequency, the tunable matching circuit to adjust a resonant frequency of the antenna array so that a probe impedance at the second frequency matches a board impedance of the system under test at the second frequency.

12. The apparatus of claim 5, further comprising:
a switching circuit coupled to the antenna array, where in response to a frequency of the signal changing from a first frequency to a second frequency, the switching circuit to adjust an arm length of at least one antenna in the array so that a probe impedance at the second frequency matches a board impedance of the system under test at the second frequency.

13. A tunable probe comprising:
a housing;
a first connector coupled to the housing to receive a radio frequency (RF) signal from an integrated circuit;
a second connector coupled to the housing to output the RF signal;
an antenna pair disposed within the housing and coupled between the first connector and the second connector, the antenna pair to couple the signal from the first connector to the second connector, wherein the antenna pair comprises a first antenna and a second antenna mounted on opposite sides of a shared substrate within the housing; and
a tunable matching circuit disposed within the housing and coupled to the antenna pair, the tunable matching circuit to tune the antenna pair so that a probe impedance of the antenna pair at a given frequency of the RF signal matches a board impedance of the integrated circuit, wherein the tunable probe does not have a physical ground connection with the integrated circuit.

14. The tunable probe of claim 13, wherein the first antenna is coupled to the first connector and the second antenna is coupled to the second connector.

15. The tunable probe of claim 14, wherein the tunable matching circuit comprises a first tunable device coupled to the first antenna and a second tunable device coupled to the second antenna.

16. The tunable probe of claim 15, wherein the tunable matching circuit is to tune the first and second tunable devices to a first value when the RF signal is received at a first frequency.

17. The tunable probe of claim 16, wherein the tunable matching circuit is to tune the first and second tunable devices to a second value when the RF signal is received at a second frequency.

18. The tunable probe of claim 17, wherein to tune the antenna pair, the tunable matching circuit is to receive a variable power supply voltage from an external power supply.

19. The tunable probe of claim 13, where in response to a frequency of the RF signal changing from a first frequency to a second frequency, the tunable matching circuit to adjust a resonant frequency of the antenna pair so that the probe impedance at the second frequency matches the board impedance at the second frequency.

20. The tunable probe of claim 13, further comprising:
a switching circuit coupled to the antenna pair, where in response to a frequency of the RF signal changing from a first frequency to a second frequency, the switching circuit to adjust an arm length of at least one of the first antenna and the second antenna so that the probe impedance at the second frequency matches the board impedance at the second frequency.

\* \* \* \* \*